United States Patent [19]
Jones et al.

[11] Patent Number: 6,066,889
[45] Date of Patent: May 23, 2000

[54] METHODS OF SELECTIVELY FILLING APERTURES

[75] Inventors: Gerald Walter Jones, Apalachin, N.Y.; Heike Marcello, Brackney, Pa.; Kostas Papathomas, Endicott, N.Y.

[73] Assignee: International Business Machines Corporation, Armonk, Calif.

[21] Appl. No.: 09/158,811

[22] Filed: Sep. 22, 1998

[51] Int. Cl.$^7$ .................................................. H01L 23/04
[52] U.S. Cl. .......................... 257/698; 257/774; 174/262
[58] Field of Search ................................... 257/773, 698; 174/262, 266; 361/792, 793, 795

[56] References Cited

U.S. PATENT DOCUMENTS

| | | |
|---|---|---|
| 3,982,045 | 9/1976 | Kukanskis . |
| 4,058,401 | 11/1977 | Crivello . |
| 4,069,055 | 1/1978 | Crivello . |

(List continued on next page.)

FOREIGN PATENT DOCUMENTS

| | | |
|---|---|---|
| 63-126775 | 5/1988 | Japan . |
| 2 301 826 | 12/1996 | United Kingdom . |

OTHER PUBLICATIONS

U.S. application No. 08/467,938, Arldt et al., filed Jun. 6, 1995, pending.
U.S. application No. 09/159,938, Lauffer et al., filed Sep. 24, 1998, pending.
U.S. application No. 08/477,373, Day et al., filed Jun. 7, 1995, pending.
U.S. application No. 08/853,211, Russell, et al., filed May 8, 1997, pending.
U.S. application No. 09/027,856, Russell et al., filed Feb. 23, 1998, pending.
U.S. application No. 09/150,824 Day et al., filed Sep. 10, 1998, pending.
U.S. application No. 07/793,889 Allen et al., filed Nov. 18, 1991, pending.
"Formation of Surface Laminar Circuit on Printed Circuit Board with Plated Through Holes", IBM Technical Disclosure Bulletin, vol. 36, No. 10, p. 511, Oct. 1993.

(List continued on next page.)

*Primary Examiner*—Sheila V. Clark
*Attorney, Agent, or Firm*—William N. Hogg

[57] ABSTRACT

A novel method of filling apertures in substrates, such as through holes, is provided. The method utilizes a photoimageable film, and comprises the following steps: applying a photoimagable, hole fill film over the apertures; reflowing the hole fill film to flow into the apertures; exposing the hole fill film to actinic radiation, preferably ultraviolet light, through a phototool, which preferably has openings slightly larger than the diameter of the apertures; then at least partially curing the hole fill film; and developing the hole fill film to remove the unexposed hole fill film. An advantage of the present method is that the apertures may be selectively filled. After the apertures are filled, the hole fill film is cured, preferably by baking. Thereafter, the substrate is preferably subjected to further processing steps; for example, nubs of cured hole fill film are preferably removed. If desired, the substrate is circuitized. If desired, features are gold plated, such as for example, electrolessly gold plated. The hole fill film preferably has solids which comprise 0 to about 20% of a thixotrope and about 80% to about 100% parts of an epoxy resin system; the epoxy resin system comprises: from about 10% to about 80% of phenoxy polyol resin which is the condensation product of epichlorohydrin and bisphenol A, having a molecular weight of from about 40,000 to about 130,000; from about 20% to about 90% of an epoxidized multifunctional bisphenol A formaldehyde novolac resin having a molecular weight of from about 4,000 to about 10,000; from about 35% to about 50% of a diglycidyl ether of bisphenol A, preferably halogenated, and having a molecular weight of from about 600 to about 2,500; and from about 0.1 to about 15 parts by weight of the total resin weight, a cationic photoinitiator. The invention also relates to circuitized structures produced according to the method.

10 Claims, 1 Drawing Sheet

U.S. PATENT DOCUMENTS

| | | |
|---|---|---|
| 4,081,276 | 3/1978 | Crivello . |
| 4,138,255 | 2/1979 | Crivello . |
| 4,169,732 | 10/1979 | Shipley . |
| 4,175,963 | 11/1979 | Crivello . |
| 4,230,814 | 10/1980 | Crivello . |
| 4,246,147 | 1/1981 | Bakus et al. . |
| 4,358,552 | 11/1982 | Shinohara et al. . |
| 4,376,815 | 3/1983 | Oddi et al. . |
| 4,378,074 | 3/1983 | Brochman . |
| 4,442,197 | 4/1984 | Crivello et al. . |
| 4,451,550 | 5/1984 | Bennett et al. . |
| 4,465,760 | 8/1984 | Leyrer et al. . |
| 4,479,983 | 10/1984 | Appelt et al. . |
| 4,544,623 | 10/1985 | Audykowski et al. . |
| 4,578,425 | 3/1986 | Santorelli . |
| 4,693,961 | 9/1987 | Bauer . |
| 4,701,351 | 10/1987 | Jackson . |
| 4,735,891 | 4/1988 | Budde et al. . |
| 4,820,549 | 4/1989 | Ozaki et al. . |
| 4,855,333 | 8/1989 | Rudik et al. . |
| 4,867,839 | 9/1989 | Sato et al. . |
| 4,882,245 | 11/1989 | Gelorme et al. . |
| 4,885,319 | 12/1989 | Dougherty et al. . |
| 4,911,786 | 3/1990 | Kindl et al. . |
| 4,940,651 | 7/1990 | Brown et al. . |
| 4,983,252 | 1/1991 | Masui et al. . |
| 4,994,346 | 2/1991 | Meier et al. . |
| 5,026,624 | 6/1991 | Day et al. . |
| 5,079,129 | 1/1992 | Roth et al. . |
| 5,208,067 | 5/1993 | Jones et al. . |
| 5,246,817 | 9/1993 | Shipley, Jr. . |
| 5,264,325 | 11/1993 | Allen et al. . |
| 5,276,290 | 1/1994 | Bladon . |
| 5,278,010 | 1/1994 | Day et al. . |
| 5,300,402 | 4/1994 | Card, Jr. et al. . |
| 5,304,457 | 4/1994 | Day et al. . |
| 5,397,685 | 3/1995 | Daniels et al. . |
| 5,439,766 | 8/1995 | Day et al. . |
| 5,443,672 | 8/1995 | Stoll et al. . |
| 5,486,655 | 1/1996 | Arike et al. . |
| 5,502,889 | 4/1996 | Casson et al. . |
| 5,528,000 | 6/1996 | Allardyce et al. . |
| 5,557,844 | 9/1996 | Bhatt et al. . |
| 5,654,126 | 8/1997 | Kukanskis et al. . |
| 5,665,526 | 9/1997 | Markovich et al. . |
| 5,667,934 | 9/1997 | Markovich et al. . |
| 5,707,749 | 1/1998 | Katagiri et al. . |
| 5,883,219 | 6/1999 | Carter et al. . |

OTHER PUBLICATIONS

"Making Integral Multilayer Circuit Boards with Cable Connection", IBM Technical Disclosure Bulletin, vol. 14, No. 3, pp. 701–702, Aug. 1971.

"Improved Composition for a Dry Film Soldermask", IBM Technical Disclosure Bulletin, vol. 33, No. 7, Dec. 1990, p. 162–163.

METHODS OF SELECTIVELY FILLING APERTURES

BACKGROUND OF THE INVENTION

Printed circuit boards contain through holes which have been drilled and typically plated. Due to drilling and plating limitations, these plated through holes are quite large with respect to the wiring. Through holes are often filled for a variety of reasons; for example, to recapture otherwise lost real-estate, or to prevent liquids used in fabrication steps from entering the through holes.

One method of filling holes involves forcing a fill composition, typically a copper filled epoxy paste, through a mask into the holes of the printed circuit board. However, such a fill composition often bleeds between the mask and the board. Also when the mask is lifted off, paste adheres to the mask and is pulled out of the through holes. Moreover, since a typical mask can only be used once, the mask must be drilled each time a set of holes is to be filled.

Conventional hole fill materials suffer from the further disadvantage in that they are not suitable when subsequent processing steps involve electroless plating of metal, because such fill materials are typically not chemically compatible with the electroless gold plating bath. The gold electroless plating bath tends to degrade the fill material, and/or leaches the fill material into the bath which interferes with the electroless plating.

It would be desirable to have an efficient technique for reliably and completely filling holes that does not cause bleeding, and does not degrade in electroless plating baths.

SUMMARY OF THE INVENTION

The present invention provides a novel method of filling apertures in substrates, such as through holes. The method utilizes a photoimageable film, and comprises the following steps: applying a photoimagable, hole fill film over the apertures; reflowing the hole fill film to flow into the apertures; exposing the hole fill film to actinic radiation, preferably ultraviolet light, through a phototool, which preferably has openings slightly larger than the diameter of the apertures; then at least partially curing the hole fill film; and then developing the hole fill film to remove the unexposed hole fill film. An advantage of the present method is that the apertures are optionally selectively filled. After the holes are filled, the hole fill film is cured, preferably by baking.

Thereafter, the substrate is preferably subjected to further processing steps; for example, nubs of cured hole fill film are preferably removed using conventional techniques. If desired, the substrate is circuitized using conventional techniques. If desired, features are gold plated using conventional techniques.

The hole fill film preferably has solids which comprise 0 to about 20% of a thixotrope and about 80% to about 100% parts of an epoxy resin system; the epoxy resin system comprises: from about 10% to about 80% of phenoxy polyol resin which is the condensation product of epichlorohydrin and bisphenol A, having a molecular weight of from about 40,000 to about 130,000; from about 20% to about 90% of an epoxidized multifunctional bisphenol A formaldehyde novolac resin having a molecular weight of from about 4,000 to about 10,000; from about 35% to about 50% of a diglycidyl ether of bisphenol A, preferably halogenated, and having a molecular weight of from about 600 to about 2,500; and from about 0.1 to about 15 parts by weight of the total resin weight, a cationic photoinitiator. The invention also relates to circuitized structures produced according to the method.

DETAILED DESCRIPTION OF THE INVENTION

Figure 1:
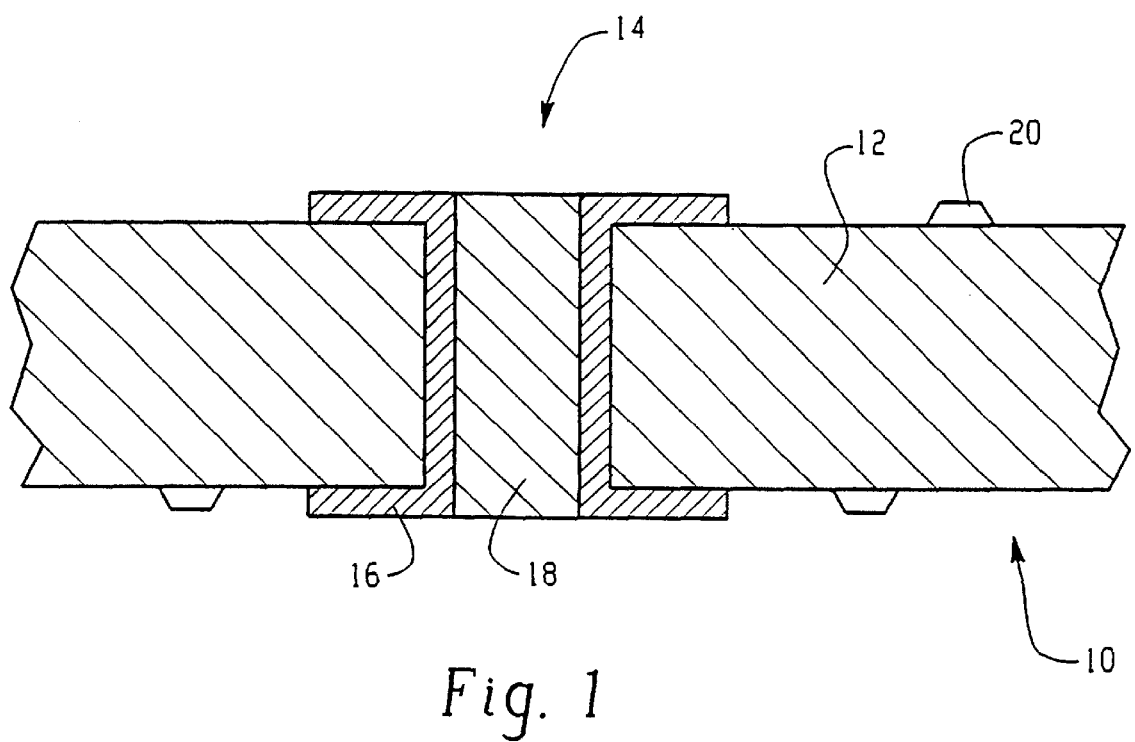
FIG. 1 shows a circuitized structure of the present invention.

The present invention provides a novel method of filling apertures in substrates, such as through holes. The method utilizes a photoimageable film and comprises the following steps: applying a photoimagable, hole-fill-film over the apertures; reflowing the hole fill film to flow into the apertures; exposing the hole fill film to actinic radiation, preferably ultraviolet light, through a phototool, which preferably has openings slightly larger than the diameter of the apertures; and developing the hole fill film to remove the unexposed hole fill film. An advantage of the present method is that the apertures are optionally selectively filled. Selective filling of the apertures is accomplished by employing a phototool which when positioned above the substrate, has openings or windows above the apertures which are to be filled, and which lacks openings or windows, above the apertures which are not to be filled. After the holes are filled, the hole fill film is cured, preferably by baking. Thereafter, the substrate is subjected to further processing.

For example, in fabricating SLC layers circuitry is preferably formed atop the substrate, using conventional techniques.

In other fabrication steps, a resist, preferably a photoresist, is applied, imaged, then etched to form circuitry. The structure is immersed in an electroless plating bath, preferably a gold plating bath, so that exposed features, such as, for example, surface mount technology pads, ball grid array pads, wire bond pads are electrolessly plated with gold. Then a solder mask is selectively applied to the structure, or it is blanket applied and then select areas are removed to reveal features which were plated. Preferably the solder mask is a permanent soldermask and is preferably dielectric. Next, electrical components, such as for example chips, or modules, are soldered to the exposed gold plated features.

The hole fill film offers the advantage in that it does not degrade in caustic solutions such as electroless gold and copper plating baths.

The Hole Fill Film

Suitable photoimageable compositions, which can be employed to make a photoimageable hole fill film, are disclosed in U.S. Pat. No. 5,026,624 to Day, et. al., issued Jun. 25, 1991 and U.S. Pat. No. 5,300,402 to Card, et al., issued Apr. 5, 1994; U.S. Pat. No. 5,264,325 to Allen, et al., issued Nov. 23, 1993, which are specifically incorporated herein by reference.

The hole fill film of the preferred embodiment is comprised of solids and solvent. The solids are preferably comprised of from 0% to about 20% of a thixotrope and from about 80% to about 100% of an epoxy resin system comprising from about 10% to 80%, preferably from about 20% to about 40%, more preferably about 30%, of phenoxy polyol resin which is the condensation product of epichlorohydrin and bisphenol A, having a molecular weight of from about 40,000 to about 130,000, preferably about 60,000 to about 90,000, more preferably greater than about 60,000; from about 20% to about 90%, preferably from about 25 to about 30%, most preferably about 25%, of an epoxidized multifunctional bisphenol A formaldehyde novolac resin having a molecular weight of from about 4,000 to about 10,000, preferably about 5,000 to about 7,000; from 0 to 50%, preferably from about 35% to about 50, more preferably about 40% to about 45%, most preferably about 45%, of a diglycidyl ether of bisphenol A having a molecular weight of from about 600 to about 2,500, preferably about 1,000 to about 1,700; from about 0.1 to about 15 parts, preferably about 5 parts, by weight of the total resin weight, a cationic photoinitiator. The diglycidyl ether of bisphenol A is preferably halogenated, more preferably brominated. The solvent component of the hole fill film preferably is comprised of propylene glycol monomethyl ether acetate and 0 to less than about 10% propylene carbonate. The propylene carbonate is preferably the carrier for the preferred photoinitiator.

Optionally, the hole fill film contains a thixotrope, such as for example silicon dioxide; fumed silica is preferred. The thixotrope preferably has a particle size of less than 10 microns, more preferably less than about 5 microns, even more preferably less than about 2 microns, most preferably less than about 1 micron. The thixotrope is optionally present in the hole fill film from 0 to about 20%, preferably from about 0.01% to about 20%, more preferably from about 0.5% to about 15%, even more preferably from about 1% to about 10%, most preferably about 1.5 to about 5% of the total solids weight.

Preferably the phenoxy polyol resin has an epoxide value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000.

Preferably, the multifunctional epoxy bisphenol A formaldehyde novolac resin has an epoxide value of from about 1 to about 10 more preferably from about 3 to about 6, most preferably about 4.7 equivalents per kilogram, a weight per epoxide of from about 180 to about 300, more preferably from about 190 to about 230, most preferably about 215 and a melting point of from about 60° to about 150°, more preferably from about 70° to about 90°, most preferably about 82° C.

Preferably, the diglycidyl ether of the bisphenol A has an epoxide value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70° C. to about 150° C., more preferably from about 80° C. to about 110° C., most preferably about 97° C.

A suitable phenoxy polyol resin is available under the trade name "PKHC", formerly available from Union Carbide Corporation, now available from Phenoxy Resin Associates. A suitable octafunctional bisphenol A formerly available under the trade name Epirez SU-8 from High Tek Polymers, is now available as "Epon SU8" from Shell Chemical Company. A suitable diglycidyl ether of bisphenol A is a tetrabromobisphenol A formerly available under the trade name "Epirez 5183" from High Tek Polymers, is now available as "Epon 1183" from Shell Chemical Company. A suitable complex triarylsulfonium hexafluoroantimonate salt photoinitiator formerly available under the trade name UVE 1014 from General Electric Company, is now available as UVI 6974 from Union Carbide Company.

Optionally a surfactant, such as for example a non-ionic surfactant is employed. Preferably the surfactant is a fluorinated polyether; a suitable surfactant is available under the trade name FC-430 surfactant from 3M Company.

The hole fill film is thermally stable, particularly at lamination temperatures preferably up to at least 125° C. for 1 hour. The hole fill film in the preferred embodiment is thermally stable particularly at electroless bath temperatures. Typically, copper electroless plating baths have a pH of at least 11, and a temperature of at least about 70° C. A typical bath contains a caustic agent typically, sodium hydroxide, formaldehyde and a copper source such as copper sulfate. Typically gold electroless plating baths have a pH of about 14, and a temperature of about 70° C. The gold bath typically contains dimethyl amino borane and caustic agents.

The hole fill film of the preferred embodiment withstands gold electroless plating bath conditions at pH 14, at least 60° C. for 45 minutes and withstands copper electroless plating bath conditions at pH 11, at least 73° C. for 10 hours.

Preparing the Hole Fill Film

First a liquid or paste composition is prepared by combining the epoxy resins, photoinitiators and solvent and mixing thoroughly. Solvent is employed to permit thorough mixing. Alternatively, various components are premixed in batch form. When employing fumed silica, the composition requires sufficient mixing to evenly disperse the fumed silica. Suitable mixers include, for example, vacuum high shear dispersion mixers.

The film is prepared by coating a liquid or paste onto a support, preferably a polymeric support, such as polyester. Suitable polyester support for the film, includes, for example, polyethylene terephthalate available under the trade name MYLAR®, from DuPont, and MELINEX from ICI. The film is applied to the polymeric support in liquid form or paste form, using conventional application methods such as, for example, curtain coating, screen coating, roller coating or spray coating. Good results have been obtained using about a 1 to 4 mil thick film.

The Method of Filling Apertures

A circuitized or non-circuitized substrate is provided, such as, for example, power cores, copper core, copper clad laminate, ceramic carrier, single or multiple surface laminar circuit layers, circuit boards, cards, carriers, organic and inorganic single chip modules, organic or inorganic multichip modules, ceramic carriers and interposer cards.

The hole fill film preferably has a solvent content in an amount sufficient to permit the hole fill film to flow into the holes. The solvent content in the hole fill film prior to application is preferably at least about 7% and preferably less than 18%; preferably the solvent content ranges from about 9% to about 15%, by weight, most preferably from about 11% to about 13.5%. Preferably, the hole fill film is applied to the substrate by placing the hole fill film film-side down and applying heat and pressure, preferably by vacuum lamination or hot roll lamination. The hole fill film is applied to one or both sides of the substrate. The hole fill film may also be formed directly on the substrate; liquid or paste compositions, which dry to a hole fill film, are applied in liquid form to the substrate such as by screen printing.

After the film is applied to the substrate, the backing, if present, is removed; optionally the solvent is driven off from the film to provide a solvent content preferably less than about 5%, more preferably less than about 3%. Good results have been obtained by drying at about 100° C. for about 1 hour. The backing is preferably reapplied before lamination.

The apertures, such as through holes, are filled with hole fill film by reflowing the hole fill film. Preferably a lamination press, more preferably vacuum lamination press, is used to impart pressure and temperature to the hole fill film to cause the film to flow into the apertures. Good results have been obtained using a vacuum lamination press at about 500 psi and about 125° C., for about 1 hour. If the hole fill film is applied to only one side there is often shrinkage on the opposite side which results in an indentation in the cured hole fill film. Accordingly, the hole film is preferably also applied to the backside of the substrate, preferably the second layer of hole film is applied using a vacuum laminator. The polymeric support is then peeled and preferably, solvent is removed from the hole fill film; good results have been obtained by drying in conventional oven at 125° C. for about one hour.

The hole fill film present in the apertures is then photoimaged using conventional techniques. Preferably, the hole fill film is exposed to ultraviolet light through desired artwork which is preferably in contact with the hole fill film, to expose the filled apertures. The hole fill film is then baked; good results have been obtained at 125° C. for about one hour. The hole fill film is then developed, preferably using propylene carbonate or butyrolactone to remove the hole fill film which was not exposed to the actinic radiation. Thus, the hole fill film remains in those apertures which were exposed to actinic radiation, along with hole fill film surrounding the perimeter of the exposed apertures. The hole fill film in the apertures is then finally cured, preferably in a two step process. First the hole fill film is exposed to ultraviolet light, preferably in the range of 250 to 400 nm, and preferably at a dosage of 4 Joules; secondly the hole fill film is thermally cured. Good thermal cures have been obtained in a convection oven at from about 150° C. to about 180° C. for about 30 to about 90 minutes.

The resulting circuitized structures include for example, circuit boards, cards, carriers, organic and inorganic single chip modules, organic or inorganic multi-chip modules, ceramic carriers and interposer cards.

As a result of the methods of the present invention, a circuitized structure is produced. As shown in FIG. 1, the circuitized structure 10, is comprised of: substrate 12, apertures 14 such as through holes or vias, disposed in substrate 12, plating 16 disposed in apertures 14, cured hole fill film 18, disposed in apertures 14, circuit lines 20, disposed atop the substrate 12. In some embodiments, as shown the FIGURE, the circuit lines 20 on the substrate 12 are shown as electrically connected to the plating 16 in apertures 14 on the substrate 12. In other embodiments, the circuit lines may not be connected to the plating.

The following examples are illustrative and not intended to limit the scope of the invention.

Example 1

A planar, copper core having drilled, plated through holes was provided. The core was chlorite treated using a conventional Shipley Black Oxide process or Alpha Prep from Alpha Metals Inc.

A photoimageable composition was prepared having a solids content of from about 86.5% to about 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethyl violet dye; 0.03% FC 430 a fluorinated polyether nonionic surfactant from 3M Company; 3.85% Aerosil 380, an amorphous silicon dioxide from Degussa. The solvent content is typically greater than about 20%. The solvent was a mixture of methyl ethyl ketone and propylene glycol monomethyl ether acetate. The photoimageable composition was coated onto a 1.42 mil thick polyethylene terephthalate designated "MYLAR®, D" a polyester carrier from Dupont. The photoimageable composition was allowed to dry to provide a 2.8 mil thick photoimageable hole fill film on the polyethylene terephthalate carrier, to provide a solvent content of from about 11 to about 13.5% of the total weight of the hole fill film.

The core was placed in a vacuum laminator so that the hole fill film was adjacent to a release sheet and next to a first surface of the core, then the core was laminated at about 60° C. for about 15 seconds. The core was then placed in a vacuum press at 125° C., 500 psi for 60 minutes. The core was then removed from the press, the MYLAR® polymeric support was removed, and the core was baked at 125° C. for about 1 hour to drive off solvent. Then the core was photoimaged by exposing it to 2000 mj/cm$^2$ ultraviolet light through a film mask. The core was then partially cured by baking at 125° C. for 1 hour and then developed with propylene carbonate. Next, the hole fill film was uv bumped, that is, blanket exposed to 4 Joules/cm$^2$ and then baked at 180° C. for 1 hour. Nubs were removed by mechanical sanding. The resulting structure had completely filled through holes.

Next, circuitry was formed by conventional processes; and prepared for gold plating using conventional processes. The core was placed in a conventional gold electroless plating bath containing dimethyl amino borane, at 60° C., pH 14 for about 45 minutes, rinsed, and then dried. The cured hole fill film was examined after the immersion in the plating bath; the cured hole fill film was intact. Microscopic examination at 30X revealed no bubbling, and no lifting of the cured hole fill film. The electroless plating bath was not contaminated.

Example 2

A planar copper core was prepared as in Example 1, except prior to placing the core in the lamination press, the core was baked at 125° C. for 60 minutes to substantially remove the solvent from the dry film.

The hole fill film was examined after the immersion in the plating bath; the cured hole fill film was intact. Microscopic examination at 30X revealed no bubbling, and no lifting of the cured hole fill film. However, somewhat less cured hole fill was present in the back side of the filled hole than was present at the front side of the hole. The electroless plating bath was not contaminated.

Example 3

A planar copper core was prepared as in Example 2, except after pressing the core in the lamination press, hole fill film was placed adjacent the second surface of the core and placed in a vacuum laminator. As a result, the backside of the filled hole contained as much cured hole fill film as the front side.

Although certain embodiments of this invention have been shown and described, various adaptations and modifications can be made without departing from the scope of the invention as defined in the appended claims.

What is claimed is:

1. A circuitized structure comprising:
   a circuitized substrate;
   apertures disposed in said circuitized substrate;
   cured hole fill film disposed in said apertures;
   wherein the hole fill film comprises solids which comprise an epoxy resin system comprising:
   i. from about 10 to about 80% of phenoxy polyol resin which is the condensation product of epichlorohydrin and bisphenol A, having a molecular weight of from about 40,000 to about 130,000;

ii. from about 20% to about 90% of an epoxidized multifunctional bisphenol A formaldehyde novolac resin having a molecular weight of from about 4,000 to about 10,000;

iii. from 0 to 50% of a diglycidyl ether of bisphenol A having a molecular weight of from about 600 to about 2,500;

from 0 to about 20% of a thixotrope.

2. The circuitized structure of claim 1, wherein there is:

from about 20% to about 40% of phenoxy polyol resin having a molecular weight of from about 60,000 to about 90,000;

from about 25 to about 30% of an epoxidized multifunctional bisphenol A formaldehyde novolac resin having a molecular weight of from about 5,000 to about 7,000;

from about 35 to about 50%, of a brominated diglycidyl ether of bisphenol A having a molecular weight of from about 1,000 to about 1,700.

3. The circuitized structure of claim 2, wherein there is:

about 30% of phenoxy polyol resin having an epoxide value of about 0.03 equivalents per kg, a weight per epoxide of about 37,000 and a glass transition temperature of about 98° C.;

about 25% of an octafunctional epoxy bisphenol A formaldehyde novolac resin having an epoxide value of about 4.7 equivalents per kilogram, as weight per epoxide of about 215 and a melting point of about 82° C.;

about 45% diglycidyl ether a tetrabromobisphenol A having an epoxide value of about 1.5 equivalents per kilogram, a weight per epoxide of about 675 and a melting point of about 97° C.; and about 5 parts by weight of the resin weight complex triarylsulfonium hexafluoroantimonate salt photoinitiator.

4. The circuitized structure of claim 2, wherein the circuitized structure is a circuit board, card, carrier, organic or inorganic single chip module, organic or inorganic multichip module, ceramic carrier, laminate chip carrier or interposer card.

5. The circuitized structure of claim 3, wherein the circuitized structure is a printed circuit board or laminate chip carrier.

6. A circuitized structure comprising:

a circuitized substrate;

apertures disposed in said substrate filled with cured hole fill film;

wherein the hole fill film comprises solids which comprise an epoxy resin system comprising:

i. from about 10 to about 80% of phenoxy polyol resin which is the condensation product of epichlorohydrin and bisphenol A, having a molecular weight of from about 40,000 to about 130,000;

ii. from about 20% to about 90% of an epoxidized multifunctional bisphenol A formaldehyde novolac resin having a molecular weight of from about 4,000 to about 10,000;

iii. from 0 to 50% of a diglycidyl ether of bisphenol A having a molecular weight of from about 600 to about 2,500;

iv. from about 0.1 to 15 parts by weight of the total resin weight, a cationic photoinitiator; and from 0 to about 20% of a thixotrope;

an electrolessly plated structure, disposed on and in contact with the substrate;

solder mask disposed on, and in contact with the substrate; electronic components, soldered or wire bonded to the electrolessly plated structure.

7. The circuitized structure of claim 6, wherein there is:

from about 20% to about 40% of phenoxy polyol resin having a molecular weight of from about 60,000 to about 90,000;

from about 25 to about 30% of an epoxidized multifunctional bisphenol A formaldehyde novolac resin having a molecular weight of from about 5,000 to about 7,000;

from about 35 to about 50%, of a brominated diglycidyl ether of bisphenol A having a molecular weight of from about 1,000 to about 1,700.

8. The circuitized structure of claim 7, wherein there is:

about 30% of phenoxy polyol resin having an epoxide value of about 0.03 equivalents per kg, a weight per epoxide of about 37,000 and a glass transition temperature of about 98° C.;

about 25% of an octafunctional epoxy bisphenol A formaldehyde novolac resin having an epoxide value of about 4.7 equivalents per kilogram, as weight per epoxide of about 215 and a melting point of about 82° C.;

about 45% diglycidyl ether a tetrabromobisphenol A having an epoxide value of about 1.5 equivalents per kilogram, a weight per epoxide of about 675 and a melting point of about 97° C.; and about 5 parts by weight of the resin weight complex triarylsulfonium hexafluoroantimonate salt photoinitiator.

9. The circuitized structure of claim 6, wherein the circuitized structure is a circuit board, card, carrier, organic or inorganic single chip module, organic or inorganic multichip module, ceramic carrier, laminate chip carrier or interposer card.

10. The circuitized structure of claim 8, wherein the circuitized structure is a printed circuit board or laminate chip carrier.

* * * * *